United States Patent [19]

Heinen

[11] Patent Number: 4,683,574
[45] Date of Patent: Jul. 28, 1987

[54] SEMICONDUCTOR LASER DIODE WITH BURIED HETERO-STRUCTURE

[75] Inventor: Jochen Heinen, Haar, Fed. Rep. of Germany

[73] Assignee: Siemens Aktiengesellschaft, Berlin and Munich, Fed. Rep. of Germany

[21] Appl. No.: 775,399

[22] Filed: Sep. 12, 1985

[30] Foreign Application Priority Data

Sep. 26, 1984 [DE] Fed. Rep. of Germany ....... 3435307

[51] Int. Cl.$^4$ .............................................. H01S 3/10
[52] U.S. Cl. ........................................ 372/44; 372/43
[58] Field of Search ....................... 372/43, 44, 45, 47; 350/354

[56] References Cited

U.S. PATENT DOCUMENTS 4,597,638  7/1986  Chemla et al. ...................... 350/354

Primary Examiner—Gene Wan
Attorney, Agent, or Firm—Hill, Van Santen, Steadman & Simpson

[57] ABSTRACT

A laser diode and a method of making the same, the diode having a semiconductor substrate, and a plurality of strip shaped heterogenous layers sequentially arranged vertically on the substrate, the heterogenous layers between them providing a strip shaped laser active zone. Additional doped semiconductor structures having a lower refractive index than the heterogenous layers are disposed laterally adjacent to the strip shaped heterogenous layers. A zone adjacent to the additional structure exists laterally of the heterogenous layers, this zone having a conductivity type different from that of the additional structures, and having a conductivity of the lowermost of the heterogenous layers, thereby providing a blocking pn junction at the sides of the heterogenous layers at the boundary between the lowermost layer and the additional structures. The zone has its dopant confined to the direction of the boundary surface between the adjacent zone and the adjoining additional structures, the dopant being diffused only from the boundary surface between the adjacent zone and the additional structures, and not being diffused from the additional structures.

16 Claims, 5 Drawing Figures

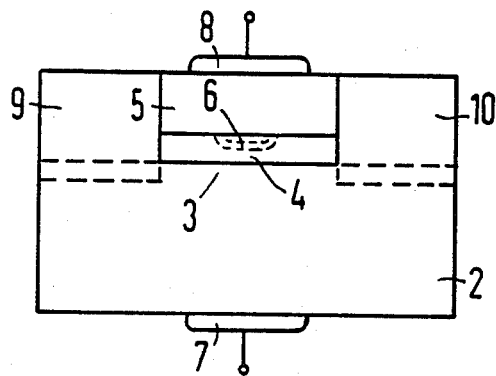
FIG 1
FIG 2
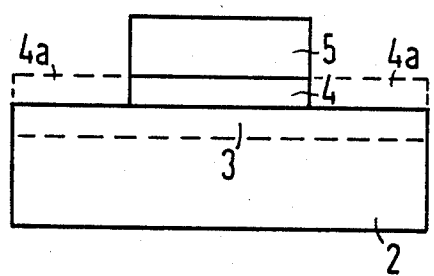
a
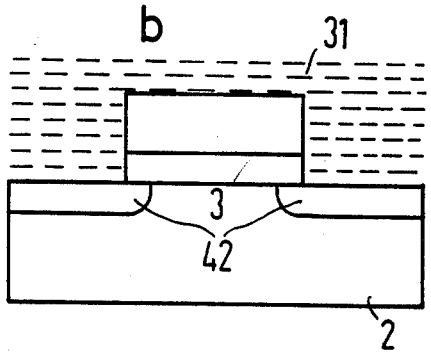
b
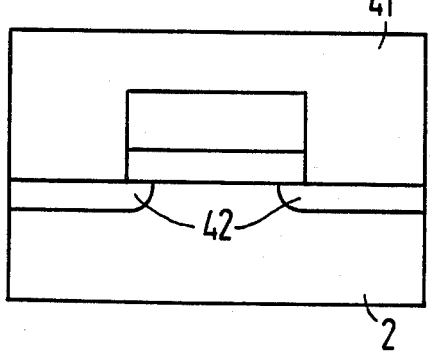
c
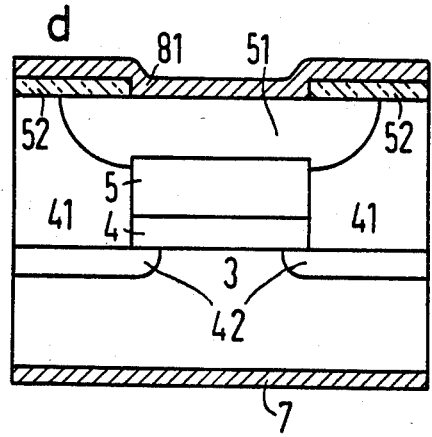
d

SEMICONDUCTOR LASER DIODE WITH BURIED HETERO-STRUCTURE

BACKGROUND OF THE INVENTION

1. Field of the Invention

This invention is in the field of manufacturing semiconductor laser diodes with buried hetero-structures wherein multiple layers of heterogenous composition are contacted with a semiconductor melt containing a dopant under conditions such that there is a solution equilibrium between the semiconductor material and at least some of the layers so that neither significant epitaxial deposition nor erosion of semiconductor material occurs from these layers but diffusion of the dopant from the melt into the adjacent zones occurs.

2. Description of the Prior Art

Semiconductor laser diodes with buried hetero-structure are known as BH lasers (buried hetero-laser). Such lasers include a substrate body and a vertical series of semiconductor layers forming the double hetero-layer structure. Between them, the layers provide a strip shaped laser zone. Contact electrodes are applied for supplying electrical current to the laser diode.

The manufacture of a BH laser with one or more barrier layers in adjoining regions usually involves two epitaxial deposition processes. In the first process, the double hetero-layer structure is generated across the entire surface of the substrate. The laser strip consisting of a narrow strip is then etched out of this structure and a contact electrode is applied thereto. In the second epitaxial process, the lateral regions which extend next to the strip of the double hetero-structure and above the lateral parts of the substrate are filled with semiconductor material. At least two semiconductor layers having opposite doping (n-p or p-n) are thereby epitaxially deposited so that an inhibiting layer sequence npn or pnp is present. The material of the substrate itself may also be included in the layer sequence of hetero-layer structures. Such a BH laser and a manufacturing method employing such epitaxial depositions including pn junctions in the lateral regions is disclosed in U.S. Pat. No. 4,426,700.

A laser diode having a different structure, namely, an RIDS laser, is known from Appl. Phys. Letters, Vol. 43 (1983), pages 809 to 811. In contrast to the BH structure, this RIDS laser has layers of diffusion-doped areas. This area-wide diffusion in one layer is based on a correspondingly area-wide diffusion of the particular dopant from a layer lying above which exists as a monolithic layer. The layer of the diffusion source remains as a permanent component of the finished laser diode.

One of the problems in the RIDS laser and in the manufacturing thereof, is to dope a central strip entirely through the strip by means of diffusion from the thickness direction. In order to achieve this, the substrate body of the known diode has been provided with a strip, even before application of any epitaxial layers whatever, whose geometric dimensions correspond to a web present in a BH laser. The function of this web is only to achieve a different layer thickness of at least a first layer deposited on the substrate member over the deposition area. Layers inhibiting electrical current flux laterally relative to the laser-active zone of the RIDS laser are epitaxially generated from the material already doped.

It is difficult, however, to grow the material of the second epitaxial process without fault at the lateral surfaces of the heterogenous layer sequence to such an extent that no leakage current paths will occur between the double hetero-layer structure and the inhibiting pn junction structure of the adjoining regions.

SUMMARY OF THE INVENTION

The present invention provides a method of manufacture for a semiconductor laser diode with buried hetero-structure wherein leakage current paths are prevented without rendering the manufacture of the diode more difficult.

In accordance with the present invention, a doped semiconductor substrate has applied to it a plurality of strip shaped heterogenous layers sequentially in the vertical direction. The heterogenous layers are such that they provide a strip shaped laser active zone between them. The lateral, exposed edges of the strip shaped heterogenous layers are contacted with a doped semiconductor melt under conditions providing a solution equilibrium between at least one of the heterogenous layers and the dopant of the melt. This substantially prevents epitaxial deposition and erosion of semiconductor material from some of the heterogenous layers while permitting diffusion of the dopant of the melt into a zone adjacent the heterogenous layers. The melt is removed after diffusion occurs into the adjacent zone, and then an additional doped semiconductor material is deposited over the adjacent zone, the conductivity type of the additional semiconductor material being opposite to that of the adjacent zone.

In the preferred form of the invention, there are three strip shaped heterogenous layers, the second and third layers being subjected to erosion, and the melt having a composition such that no significant epitaxial deposition or erosion of all three layers occurs during contact with the melt.

In another form of the invention, the solution equilibrium is such that no significant epitaxial deposition occurs, no significant erosion of material of the first and third layers occurs, but the material of the middle or second layer is completely eroded outside the confines of the strip shaped layers.

The additional doped semiconductor material is doped in the region of intended current feed so that it has the same conductivity type as the adjacent layer of the strip shaped layers. This doping may conveniently be accomplished through a mask, the mask remaining as part of the structure.

As far as materials are concerned, the substrate is preferably n-conductive indium phosphide, and the three heterogenous layers are, from bottom to top, n-conductive indium phosphide, p-conductive indium gallium arsenide phosphide, and p-conductive indium phosphide, respectively. The melt is preferably a phosphorus-saturated indium with a p-dopant and the additional material is an n-conductive indium phosphide.

BRIEF DESCRIPTION OF THE DRAWINGS

A further description of the present invention will be made in connection with the attached sheet of drawings in which:

FIG. 1 is a greatly enlarged side elevational view of a buried hetero-laser construction; and FIGS. 2a through 2d illustrate somewhat schematically the sequence of process steps involved in producing the improved semiconductor laser diode of the present invention.

DESCRIPTION OF THE PREFERRED EMBODIMENTS

A semiconductor laser diode with a buried heterostructure is shown in FIG. 1. As illustrated, a semiconductor substrate body 2 with a semiconductor double hetero structure vertically disposed semiconductor layers 3, 4 and 5 is provided. The lowermost layer 3 may be a part i.e. an upmost zone of the substrate member 2. This zone and layer sequence 3, 4, 5 is referred to as a sequence B/A/B which forms the double hetero-layer structure. A laser active zone 6 in the form of a strip generates the laser radiation and lies within this sequence of layers. Contact electrodes 7 and 8 are applied at opposite ends for supplying electrical current to feed the laser diode.

In order for the current flowing through the laser diode to be limited to the strip of the double heterolayer structure 3, 4, 5, there is a barrier layer structure with pn junctions or with npn (pnp) junctions generated in regions 9 and 10 on both sides of the laser-generating structure. Current flow outside of the double heterolayer structure is prevented by means of this barrier effect. The semiconductor material of the regions 9 and 10 is such that it has a lower refractive index compared with the semiconductor material of the active layer. The laser diode thus has a dielectric waveguide for the laser emission generated in the laser active zone 6. This is referred to as index guidance.

The manufacture of a BH laser with one or more barrier layers in the lateral regions 9, 10 usually takes place in two epitaxial deposition processes, as previously explained. In the first process, the double heterolayer structure 3, 4, 5 is generated over the entire width of the surface of the substrate 2. The laser strip in the form of a narrow web is then etched out of the structure to produce a structure which is shown in FIG. 1 as a frontal view comprising the layers 3, 4, 5, and the contact electrode 8 situated thereon. In the second epitaxial process, the lateral regions 9 and 10 which extend adjacent to the web of the double hetero-structure 3, 4, 5 and above the lateral portions of the substrate 2 are filled with semiconductor material. At least two semiconductor layers having opposite doping (n-p or p-n) are thereby epitaxially deposited with doped material so that finally, an inhibiting layer sequence npn (or pnp) is produced. The material of the substrate body 2, for example, is also included in this three-layer sequence. Such a BH laser is discussed in the aforementioned U.S. Pat. No. 4,426,700.

The improvements of the present invention are achieved by the process diagramatically illustrated in FIGS. 2a through 2d. In these Figures, reference numeral 2 indicates a substrate body on which a double hetero-layer structure 3, 4, 5 is situated. The lowermost layer or zone 3, as in the example of FIG. 1, may be part of the substrate body 2. For example, the substrate body 2 and the layer or zone 3 can be composed of indium phosphide, the layer 4 of indium gallium arsenide phosphide, and the layer 5 of indium phosphide. In this example, the material of the substrate body 2 and of the layer 3 are n-doped and the two layers 4 and 5 are p-doped. As in the prior art described previously, the layer sequence is preferably produced by epitaxy and the geometry of the web of the strip is produced by etching. The etching is carried out such that the web is etched free exactly up to below the layer 4, i.e., laterally up to beneath the active zone 6 and the material then laterally exposed is n-conductive. FIG. 2a illustrates this condition which results after etching.

As is customary in the manufacture of semiconductor components, a plurality of structures as shown in FIG. 2a are simultaneously produced which are arranged side-by-side or in a larger semiconductor substrate wafer. A semiconductor substrate wafer having a plurality of such structures for producing individual components of a laser diode is subsequently brought into contact with a fluid phase epitaxy system consisting of a semiconductor material melt 31 containing a p-dopant (for example, zinc, cadmium, or magnesium). In accordance with the present invention, the melt is adjusted such that it is in solution equilibrium with the indium phosphide of the substrate body 2 or of the semiconductor substrate wafer containing a plurality of such substrate bodies. Typically, a phosphorus-saturated indium melt is employed. The equilibrium assures that indium phosphide of the substrate body 2 or of the semiconductor wafer and/or the layer sequence 3, 4, 5 is not dissolved, which could occur if the melt were less than saturated. It also assures that p-indium phosphide does not epitaxially grow from the melt which would occur with a melt that is overly saturated. On the contrary, what is achieved in the method of the invention indicated in FIG. 2b is that only the dopant diffuses into the semiconductor material and that only a zone 42 adjacent the surface, and theretofore being n-conductive indium phosphide, is made p-conductive at the semiconductor structure of FIG. 2a. This zone 42 can be on the order of a few tenths of a micron in thickness. The thickness can be controlled by selecting the duration and the temperature of the diffusion.

FIG. 2b shows the results achieved with the method of the present invention, including the diffusion under the layer 4. The diffused zones 42 clearly lie under the layer 4 which essentially contains the laser active zone 6. By means of this improvement, the layer 3 is rendered exclusively p-conductive at its surface which faces the regions 9 and 10 lying laterally with respect to the strip of heterogenous layers, whereby the thickness of the layer diffused in is limited to a few tenths of a micron. This can be controlled by the selection of the diffusion duration and the temperature applied.

The entire diffusion process is ended by depositon of the material of the melt 31 whereby neither a growth of semiconductor material nor an erosion of semiconductor material from the structure of the layers 3, 4, 5 of FIG. 2a has occurred substantially during this diffusion process.

After the diffusion illustrated in FIG. 2b has been carried out, an additional semiconductor material can be brought to epitaxial growth by applying a further semiconductor melt on it. As shown, for example, in FIG. 2c, n-doped indium phosphide is allowed to grow. This can be done either selectively only in the lateral regions 9 or 10 or, as shown in FIG. 2c, for the width of the surface. A blocking pn junction with topically defined positions in the plane of the underside of the layer 4 in which the laser active zone is situated thus occurs. With surface-wide growth, n-conductive semiconductor material first rises above the uppermost layer 5 of the double hetero-layer structure which would cause a barrier-free connection from the contact 8 to the double hetero-layer structure to be lost. As shown in FIG. 2d a further diffusion is accordingly carried out through a strip mask so that a p-conductive region 51 is produced in the previously deposited n-indium phosphide layer 41.

The strip mask employed for the diffusion of the region 51 is preferably a surface coating of, for example, silicon dioxide illustrated at reference numeral 52 in FIG. 2d, and this mask can remain as part of the final structure. A contact electrode 81 is provided, for example, in the form of a planar metal coating.

A modification of the above-described method consists in providing a lightly doped layer 3 on the substrate which is highly doped in comparison thereto, as shown in FIG. 2a with broken lines. The layer 3 and the substrate 2 therefore have doping of the same conductivity type, for example, they are both n-conductive. In accordance with the highly different doping degrees, re-doping is carried out by means of the melt 31 in the lateral regions 9 and 10 at the sides of the layers 4, 5, preferably into the layer 3 over its entire thickness. The substrate 2, however, remains unchanged.

A further modification is to first allow the entire layer 4 together with the portions 4a to remain during etching and to dissolve these parts 4a by means of the melt 31 with which the material of this very thin layer 4 is not in solution equilibrium. This modification has the advantage that the dissolving stops exactly at the boundary between the layers 2 and 4, corresponding to the aforementioned etching exactly up to the boundary surface of the layers 4 and 3.

With these two modifications, the remaining method steps can be carried out virtually unchanged.

In comparison with U.S. Pat. No. 4,426,700, the zones 42 are just as geometrically planar as the layer 3 or the portion of the substrate 2 which corresponds to the layer 3. Furthermore, the under-diffusion under the edges of the layer 4 also relies on this effect. The direction of the in-diffusion can be determined from the diffusion profile that has been produced.

It will be evident that various modifications can be made to the described embodiments without departing from the scope of the present invention.

I claim as my invention:

1. A laser diode comprising:
a semiconductor substrate,
a plurality of strip shaped heterogenous layers sequentially arranged vertically on said substrate, said heterogenous layers between them providing a strip shaped laser active zone,
additional doped semiconductor structures having a lower refractive index than said heterogenous layers lying laterally adjacent to said strip shaped heterogenous layers,
a zone adjacent to said additional structures laterally of said homogenous layers, said zone having a conductivity type different from that of said additional structures, and of the conductivity of the lowermost of said heterogenous layers, thereby providing a blocking pn junction at the side of said heterogenous layers at the boundary between said lowermost layer and said additional structures,
said zone having its dopant confined to the direction of the boundary surface between the adjacent zone and the adjoining additional structures, said dopant being diffused only from the boundary surface between said adjacent zone and said additional structure and not diffused from said additional structures.

2. A laser diode according to claim 1 wherein said lowermost layer is part of said substrate.

3. A laser diode comprising:
a semiconductor substrate,
a double-heterostructur formed by heterogenous zones comprising
a plurality of strip shaped heterogenous layers sequentially arranged vertically on said substrate, said heterogenous layers between them providing a strip shaped laser active zone,
additional doped semiconductor structures having a lower refractive index than said heterogenous layers lying laterally adjacent to said strip shaped heterogenous layers,
zone adjacent to said additional structures laterally of said homogenous layers, said zone having a conductivity type different from that of said additional structures, and of the conductivity of the lowermost of said heterogenous zones, thereby providing a blocking pn junction at the side of said heterogenous layers at the boundary between said lowermost zone and said additional structures,
said zone having its dopant confined to the direction of the boundary surface between the adjacent zone and the adjoining additional structures, said dopant being diffused only from the boundary surface between said adjacent zone and said additional structure and not diffused from said additional structures.

4. A laser diode according to claim 3 wherein said lowermost layer is a zone of said substrate.

5. A method for the manufacture of a laser diode comprising:
providing a doped semiconductor substrate, applying a plurality of strip shaped heterogenous layers sequentially over said substrate, the lateral edges of said heterogenous layers being exposed, said heterogenous layers between them providing a strip shaped laser active zone,
contacting said lateral edges with a doped semiconductor melt under conditions providing a solution equilibrium between at least one of the heterogenous layers and the dopant of said melt, thereby substantially preventing substantial epitaxial deposition and erosion of said semiconductor material from some of said heterogenous layers, while permitting diffusion of the dopant of the melt into a zone adjacent said heterogenous layers,
removing said melt after such diffusion into said adjacent zone, and
depositing an additional doped semiconductor material over said adjacent zone, the conductivity type of said additional semiconductor material being opposite to that of said adjacent zone.

6. A method according to claim 5 wherein there are three strip shaped heterogenous layers, the second and third layers being subjected to erosion and the melt having a composition such that no significant epitaxial deposition or erosion of all three layers occurs during contact with said melt.

7. A method according to claim 6 wherein said solution equilibrium is such that no significant epitaxial deposition occurs, no significant erosion of material of the first and third layers occurs, but the material of the middle layer is completely eroded outside the confines of said strip shaped layers.

8. A method according to claim 7 which includes the steps of doping the additional material in the region of intended current feed so that it has the same conductivity type as the adjacent layer of the strip shaped layers.

9. A method according to claim 8 wherein said doping is accomplished through a mask, the mask remaining as part of the structure.

10. A method according to claim 6 wherein said substrate is n-conductive indium phosphide, said three heterogenous layers are, from bottom to top, n-conductive indium phosphide, p-conductive indium gallium arsenide phosphide, and p-conductive indium phosphide, respectively, said melt is a phosphorus saturated indium with a p-dopant, and said additional material is n-conductive indium phosphide.

11. A method for the manufacture of a laser diode comprising:
providing a doped semiconductor substrate, with at least three heterogenous zones,
applying a plurality of at least two heterogenous layers as two of said zones sequentially over said substrate, exposing lateral edges of two adjacent of said heterogenous layers, said two heterogenous layers between them providing a strip shaped laser active zone,
contacting said lateral edges and said a third zone semiconductor melt doped with the dopant for said third zone and being under condition providing a solution equlibrium between that of said first and said third zone, thereby substantially preventing substantial epitaxial deposition and erosion of said semiconductor material from said first and third zone, while permitting diffusion of the dopant of the melt into said third zone adjacent the second heterogenous layer,
removing said melt after such diffusion into said third zone, and
depositing an additional doped semiconductor material over said third zone, the conductivity type of said additional semiconductor material being opposite to that of said third zone.

12. A method according to claim 11 wherein providing the solution equilibrium so that no significant epitaxial deposition or erosion of all three layers and zones respectively occurs during contact with said melt.

13. A method according to claim 12 wherein said solution equilibrium is such that no significant epitaxial deposition occurs, no significant erosion of material of the first and third layers occurs, but the material of the middle layer is completely eroded outside the confines of said strip shaped layers.

14. A method according to claim 13 which includes the steps of doping the additional material in the region of intended current feed so that it has the same conductivity type as the adjacent layer of the strip shaped layers.

15. A method according to claim 14 wherein said doping is accomplished through a mask, the mask remaining as part of the structure.

16. A method according to claim 12 wherein said substrate is n-conductive indium phosphide, said three heterogenous layers are, from bottom to top, n-conductive indium phosphide, p-conductive indium gallium arsenide phosphide, and p-conductive indium phosphide, respectively, said melt is a phosphorus saturated indium with a p-dopant, and said additional material is n-conductive indium phosphide.

* * * * *